United States Patent
Liow et al.

(10) Patent No.: US 9,571,079 B2
(45) Date of Patent: Feb. 14, 2017

(54) INTEGRATED CIRCUIT AND SIGNAL MONITORING METHOD THEREOF

(71) Applicant: UNITED MICROELECTRONICS CORPORATION, Hsinchu (TW)

(72) Inventors: Yu-Yee Liow, Zhubei (TW); Ya-Nan Mou, Hsinchu (TW); Yuan-Hui Chen, Hsinchu (TW); Shih-Chin Lin, Zhubei (TW); Po-Hua Chen, Erlin Township (TW); Wen-Hong Hsu, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/938,827

(22) Filed: Nov. 11, 2015

(65) Prior Publication Data
US 2016/0373095 A1    Dec. 22, 2016

(30) Foreign Application Priority Data
Jun. 22, 2015   (TW) .............................. 104120037 A

(51) Int. Cl.
| | | |
|---|---|---|
| *H03H 11/26* | (2006.01) | |
| *H03K 5/13* | (2014.01) | |
| *G01R 19/00* | (2006.01) | |
| *H03K 5/00* | (2006.01) | |

(52) U.S. Cl.
CPC ........... *H03K 5/133* (2013.01); *G01R 19/0084* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 5,574,866 | A * | 11/1996 | Smith ................. | G06F 13/4239 327/276 |
| 6,157,222 | A * | 12/2000 | Yaklin .................. | H03K 17/302 324/74 |
| 7,629,825 | B1 * | 12/2009 | Fung ................. | H03K 19/17736 327/269 |
| 8,120,409 | B2 * | 2/2012 | Keskin ................... | H03K 5/131 327/158 |
| 8,963,600 | B2 * | 2/2015 | Mann .................... | G04F 10/005 250/363.04 |
| 2003/0001649 | A1 * | 1/2003 | Saint-Laurent ...... | H03H 11/265 327/276 |
| 2011/0187433 | A1 * | 8/2011 | Baumann ............... | H03K 5/135 327/276 |
| 2012/0306477 | A1 * | 12/2012 | Daigle ................. | H03K 5/2481 324/123 R |

(Continued)

*Primary Examiner* — Lincoln Donovan
*Assistant Examiner* — Khareem E Almo
(74) *Attorney, Agent, or Firm* — Ding Yu Tan

(57) ABSTRACT

An integrated circuit includes a signal generating unit, a signal monitoring unit and a processing unit. The signal generating unit is configured to generate a control signal. The signal monitoring unit is configured to receive the control signal and accordingly output a monitor signal. The processing unit is configured to receive the monitor signal. The control signal is adjusted until the monitor signal is located within a preset range. A signal monitoring method used with the integrated circuit and a signal monitoring method used with a plurality of transistors are also provided.

17 Claims, 6 Drawing Sheets

(56) References Cited

U.S. PATENT DOCUMENTS

2013/0002355 A1\* 1/2013 Toda .................. H03F 1/223
                                                    330/257
2013/0120047 A1\* 5/2013 Dally ................ H03H 11/265
                                                    327/276

\* cited by examiner

INTEGRATED CIRCUIT AND SIGNAL MONITORING METHOD THEREOF

FIELD OF THE INVENTION

The present invention relates to an integrated circuit, and more particularly to an integrated circuit for monitoring and adjusting the threshold voltage of circuit elements. A signal monitoring method used with the integrated circuit is also provided.

BACKGROUND OF THE INVENTION

With the progress of semiconductor manufacturing technology, the area or dimensional sizes of components and circuits have been substantially reduced and therefore the operating voltage for driving the components and circuits is also reduced. However, at the meantime when the operating voltage is reduced, the variation range of the threshold voltage which is closely related to the ON/OFF of components is not correspondingly reduced. As a result, the conduction efficiency of some components may not reach to the expectation and consequentially the operating performance of the whole circuit may be affected. Thus, it is quite important to develop a means to control and adjust the threshold voltage of components within a proper range more efficiently.

SUMMARY OF THE INVENTION

Therefore, one aspect of the present invention is to provide an integrated circuit with signal monitoring function. Through the integrated circuit, the threshold voltage of the circuit element in the circuit block controlled by the integrated circuit is adjusted within a proper range.

Another aspect of the present invention is to provide a signal monitoring method used with the aforementioned integrated circuit.

Still another aspect of the present invention is to provide a signal monitoring method used with a plurality of transistors.

The present invention discloses an integrated circuit, which includes a signal generating unit, a signal monitoring unit and a processing unit. The signal generating unit is configured to generate a control signal. The signal monitoring unit is configured to receive the control signal and accordingly output a monitor signal. The processing unit is configured to receive the monitor signal. The control signal is adjusted until the monitor signal is located within the preset range.

In a preferred embodiment of the present invention, the signal monitoring unit is a signal carrier configured to receive the control signal and generate a corresponding time delay signal as the monitor signal.

In a preferred embodiment of the present invention, the signal monitoring unit includes a delay unit. The delay unit includes at least one inverter. The at least one inverter includes a plurality of transistors, and the transistors of the inverters are configured to have their base ends electrically connected together for receiving the control signal.

In a preferred embodiment of the present invention, the monitor signal has a delay time to the control signal, and the processing unit determines the control signal through comparing the delay time.

In a preferred embodiment of the present invention, each inverter of the delay unit includes a first transistor and a second transistor. The first transistor has a source end, a drain end, a gate end and a base end. The first transistor is configured to have its gate end and source end for receiving an operating voltage and its base end for receiving the control signal. The second transistor has a source end, a drain end, a gate end and a base end. The second transistor is configured to have its drain end electrically connected to the drain end of the first transistor as the inverter output, its source end for receiving a reference voltage, its base end electrically connected to the base end of the first transistor, and its gate end as the inverter input. The delay unit is formed by coupling the inverters in series.

In a preferred embodiment of the present invention, the signal generating unit further includes a digital-analog converter and a unity gain buffer. The processing unit outputs a digital trimming code to the digital-analog converter when the monitor signal is not located within the preset range. The digital-analog converter converts the received digital trimming code into an analog signal and outputs the analog signal to the unity gain buffer. The unity gain buffer is configured to process the received analog signal and accordingly outputs the adjusted control signal to the base ends of all of the transistors in the inverters until the monitor signal is located within the preset range.

In a preferred embodiment of the present invention, each inverter of the delay unit includes a first transistor and a second transistor. The first transistor has a source end, a drain end, a gate end and a base end. The first transistor is configured to have its source end for receiving an operating voltage and its base end for receiving the control signal, its gate end as the inverter input. The second transistor has a source end, a drain end, a gate end and a base end. The second transistor is configured to have its drain end electrically connected to the drain end of the first transistor as the inverter output, its source end and gate end for receiving a reference voltage, and its base end electrically connected to the base end of the first transistor. The delay unit is formed by coupling the inverters in series.

In a preferred embodiment of the present invention, the signal monitoring unit is a signal carrier configured to receive the control signal and generate a corresponding frequency phase delay signal as the monitor signal.

In a preferred embodiment of the present invention, the signal monitoring unit includes an oscillator. The oscillator includes at least one inverter, and the transistors of the inverters are configured to have their base ends electrically connected together for receiving the control signal.

In a preferred embodiment of the present invention, the monitor signal has a frequency phase delay to the control signal, and the processing unit determines the control signal through comparing the frequency phase delay.

In a preferred embodiment of the present invention, each inverter of the oscillator includes a first transistor and a second transistor. The first transistor has a source end, a drain end, a gate end and a base end. The first transistor is configured to have its gate end and source end for receiving an operating voltage and its base end for receiving the control signal. The second transistor has a source end, a drain end, a gate end and a base end. The second transistor is configured to have its drain end electrically connected to the drain end of the first transistor as inverter output, its source end for receiving a reference voltage, its base end electrically connected to the base end of the first transistor, and its gate end as the inverter input. A close-loop circuit is formed by coupling the inverters in series, thereby forming the oscillator.

In a preferred embodiment of the present invention, each inverter of the oscillator includes a first transistor and a second transistor. The first transistor has a source end, a drain end, a gate end and a base end. The first transistor is configured to have its source end for receiving an operating voltage, its base end for receiving the control signal, and its gate end as the inverter input. The second transistor has a source end, a drain end, a gate end and a base end. The second transistor is configured to have its drain end electrically connected to the drain end of the first transistor as the inverter output, its source end and gate end for receiving a reference voltage, and its base end electrically connected to the base end of the first transistor. A close-loop circuit is formed by coupling the inverters in series, thereby forming the oscillator.

The present invention further discloses a signal monitoring method use with an integrated circuits. The integrated circuit includes a signal generating unit, a signal monitoring unit and a processing unit The signal monitoring method includes steps of: configuring the signal generating unit to provide a control signal to the substrates of all transistors in the signal monitoring unit; configuring the signal monitoring unit to output a monitor signal according to the received control signal, converting the monitor signal into meaningful monitoring information and determining whether the monitoring information is located within a preset range recorded in a lookup table; and adjusting the control signal until the monitoring information is located within the preset range.

The present invention still further discloses a signal monitoring method used with a plurality of transistors. The signal monitoring method includes steps of: providing a control signal to the substrates of the transistors; converting a monitor signal, which is outputted from the transistors based on the received control signal, into meaningful monitoring information and determining whether the monitoring information is located within a preset range recorded in a lookup table; and adjusting the control signal until the monitoring information is located within the preset range.

In summary, the integrated circuit of the present invention employs the aforementioned circuit structure to monitor and adjust the aforementioned monitor signal, outputs the adjusted control signal to the circuit block which is controlled by the integrated circuit, and determines whether the monitor signal outputted from of the signal monitoring unit is within a preset range based on the lookup table stored in the processing unit. Specifically, when it is determined that the monitor signal is not within the preset range, the control signal generated by the signal generating unit is adjusted until the motor signal is within the preset range recorded in the lookup table. In addition, through the signal monitoring unit, the integrated circuit of the present invention generates the time delay signal, frequency signal or phase delay signal which are corresponding to the threshold voltage. These analog signals corresponding to the threshold voltage are converted into digital information by the processing unit and the digital information is used to determine whether the control signal is needed to adjust based on a comparison between the threshold voltage restored in the lookup table and a preset value of the digital information. Then, the threshold voltage of each element in the circuit block controlled by the integrated circuit of the present invention can be adjusted through adjusting the control signal. As a result, the threshold voltage of each element in the circuit block controlled by the integrated circuit of the present invention can be effectively adjusted to locate within the preset range and consequentially the entire circuit can be operated more quickly and stably.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
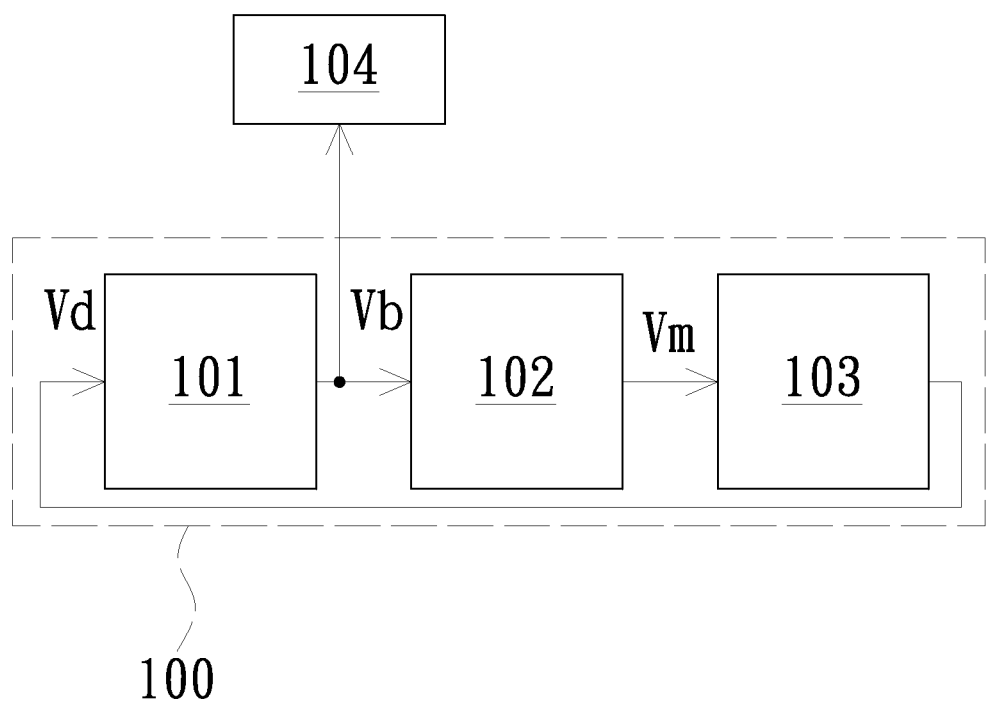
FIG. 1 is a block diagram of an integrated circuit in accordance with an embodiment of the present invention.

FIG. 1 is a block diagram of an integrated circuit in accordance with an embodiment of the present invention. As shown in FIG. 1, the integrated circuit 100 in the present embodiment includes a signal generating unit 101, a signal monitoring unit 102 and a processing unit 103. For a semiconductor wafer, in general, it is to be noted that the manufacturing process variation may cause the circuit elements located in different blocks of wafers having different threshold voltages; wherein the threshold voltage difference between the circuit elements located in adjacent blocks is relatively small. Therefore, the integrated circuit 100 in the present embodiment is disposed on a wafer (not shown) and configured to monitor and adjust the threshold voltages of the circuit elements in a circuit block 104; wherein it is to be noted that all the circuit elements in the circuit block 104 substantially have the same threshold voltage. In the present embodiment, the signal generating unit 101 is configured to generate a control signal Vb. The signal monitoring unit 102 is configured to receive the control signal Vb from the signal generating unit 101 and accordingly output a monitor signal Vm. Specifically, the monitor signal Vm may contain various types of information such as time delay information, frequency information or phase delay information; wherein it is to be noted that different threshold voltages correspond to different information values of the time delay information, frequency information or phase delay information. The processing unit 103 is stored with a lookup table (not shown) and configured to receive the monitor signal Vm from the signal monitoring unit 102 and determine whether the information value of the time delay information, frequency information or phase delay information contained in the received monitor signal Vm is located within a preset range or not in accordance with the stored lookup table. When it is determined that the information value of the time delay information, frequency information or phase delay information contained in the received monitor signal Vm is not located within the preset range, the processing unit 103 is further configured to output a digital signal Vd to adjust the control signal Vb of the signal generating unit 101 until the information value of the time delay information, frequency information or phase delay information contained in the currently received monitor signal Vm is located within the preset range. It is to be noted that besides being transmitted to the signal monitoring unit 102, the adjusted monitor signal Vm is also transmitted to the circuit block 104 which is controlled by the integrated circuit 100. In the present embodiment, the digital signal Vd is a group of digital trimming code.

In the present embodiment, the signal monitoring unit 102 is a signal carrier, which is used to receive the control signal Vb from the signal generating unit 101 and then correspondingly generates a time delay signal, a frequency signal or a phase delay signal containing the aforementioned time delay information, frequency information or phase delay information, respectively; wherein each of the time delay signal, frequency signal or phase delay signal contains an information value corresponding to a specific threshold voltage. The processing unit 103 may be implemented with a time-digital converter (not shown) and a digital control unit (not shown) or implemented with a frequency-digital converter (not shown) and a digital control unit. In the embodiment that the processing unit 103 is implemented with a time-digital converter and a digital control unit, the time-digital converter is configured to convert the received time delay signal into a digital signal and determine whether the information value of the digital signal is located within a preset range recorded in the stored lookup table or not. When it is determined that the information value is not located within the preset range, the digital control unit is configured to control and adjust the control signal Vb of the signal generating unit 101. The circuit structure and operating method of the signal monitoring unit 102 will be further described in the following various embodiments. In the present embodiment, the integrated circuit 100 is exemplified by including the processing unit 103 for generating the digital signal Vd to adjust the control signal Vb of the signal generating unit 101, so that the integrated circuit 100 can automatically adjust the control signal Vb of the signal generating unit 101 according to the digital signal Vd until the information value of the time delay information, frequency information or phase delay information contained in the monitor signal Vm is located within the preset range. However, the integrated circuit 100 may not need to include the processing unit 103 in another embodiment. Instead of the processing unit 103, an additional circuit (not shown) may be arranged outside the integrated circuit 100 and configured to monitor the monitor signal Vm and correspondingly adjust the control signal Vb.

Figure 2:
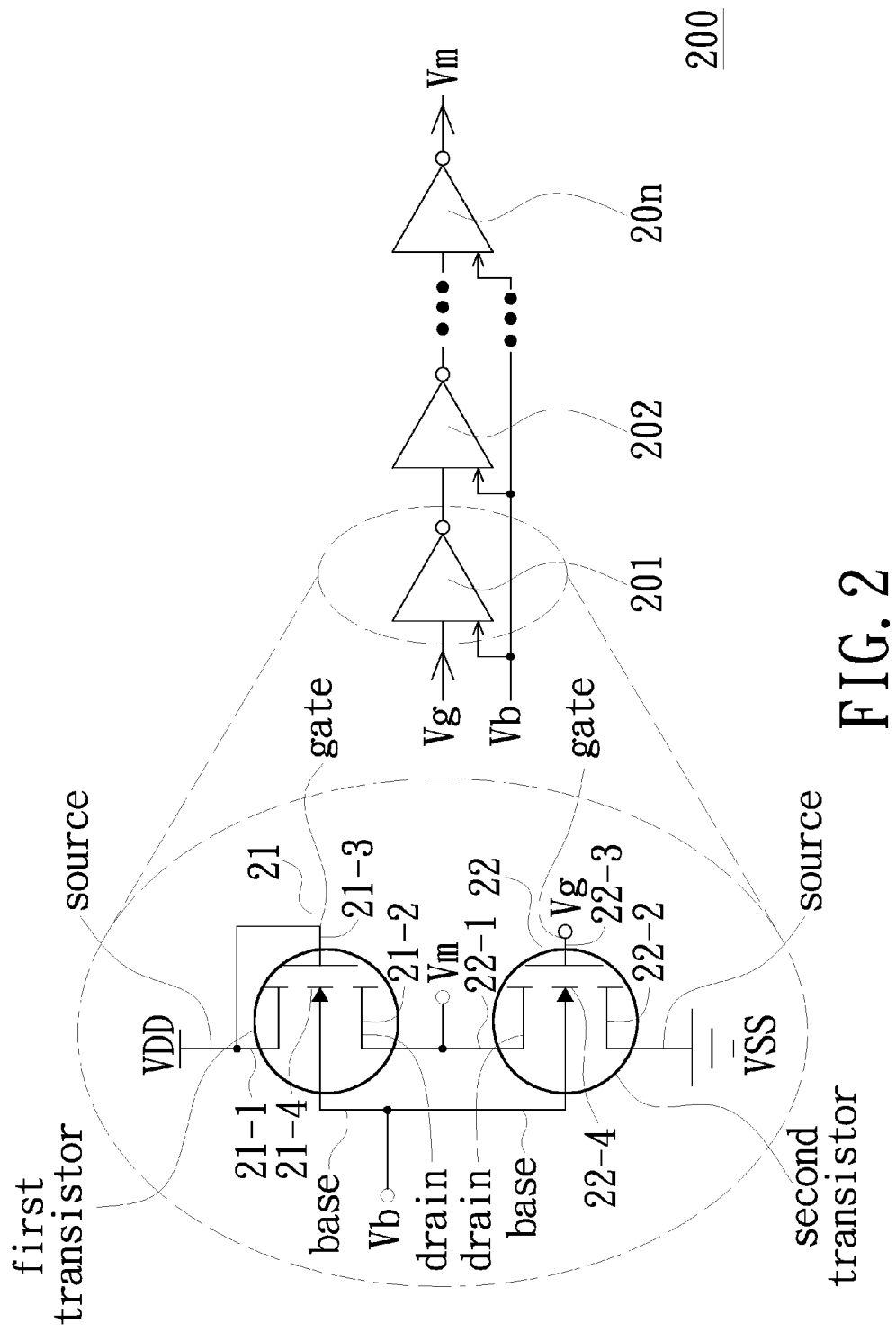
FIG. 2 is a schematic circuit diagram of a signal monitoring unit in accordance with an embodiment of the present invention.

FIG. 2 is a schematic circuit diagram of a signal monitoring unit in accordance with an embodiment of the present invention. As shown in FIG. 2, the signal monitoring unit 200 in the present embodiment is substantially implemented with a delay unit constituted by a plurality of stages of inverters coupled in series. Specifically, the signal monitoring unit 200 includes a plurality of stages of inverters 201~20n coupled in series, wherein n is a positive integer. Each inverter includes a first transistor 21 and a second transistor 22, wherein the first transistor 21 and the second transistor 22 may be N-type transistors. The first transistor 21 has a first end (or, source end) 21-1, a second end (or, drain end) 21-2, a gate end 21-3 and a base end 21-4. The first transistor 21 is configured to have its gate end 21-3 and first end 21-1 for receiving an operating voltage VDD and its base end 21-4 for receiving the control signal Vb. The second transistor 22 has a first end 22-1, a second end 22-2, a gate end 22-3 and a base end 22-4. The second transistor 22 is configured to have its first end 22-1 electrically connected to the second end 21-2 of the first transistor 21, its second end 22-2 for receiving a reference voltage VSS, and its base end 22-4 electrically connected to the base end 21-4 of the first transistor 21. In the first-stage inverter 201, specifically, the second transistor 22 is further configured to have its gate end 22-3 for receiving a gate signal Vg and its first end 22-1 electrically connected to the gate end 22-3 of the second transistor 22 in the second-stage inverter 202; wherein for brevity, the connection between the first-stage inverter 201 and the second-stage inverter 202 is not shown. In the last-stage inverter 20n, specifically, the second transistor 22 is further configured to have its first end 22-1 for outputting the monitor signal Vm. In addition, it is to be noted that the signal monitoring unit 200 in the present embodiment is configured to monitor the threshold voltages of the N-type transistors in the circuit block 104 in FIG. 1.

Please refer to FIGS. 1 and 2. Specifically, the signal generating unit 101 generates the analog control signal Vb according to a group of digital input signals Vd, wherein the control signal Vb is substantially equal to the voltage at the base end 21-4 of the first transistor 21 and the base end 22-4 of the second transistor 22 of the respective inverter. When the operating voltage VDD is provided to the first transistors 21 of the signal monitoring unit 200 and the gate end 22-3 of the second transistor 22 in the first-stage inverter 201 receives the gate signal Vg, the first end 22-1 of the second transistor 22 in the first-stage inverter 201 correspondingly outputs the monitor signal Vm. This monitor signal Vm is then inputted to the gate end 22-3 of the second transistor 22 in the second-stage inverter 202, thereby driving the second-stage inverter 202 and consequentially the first end 22-1 of the second transistor 22 in the second-stage inverter 202 correspondingly outputs the monitor signal Vm. Because the inverters 201~20n are electrically connected in series, the monitor signal Vm generated by the first-stage inverter 201 is sequentially transmitted through the remaining inverters 202~20n until the last-stage inverter 20n outputs the monitor signal Vm to the processing unit 103. It is to be noted that the time delay information of the time delay signal contained in the monitor signal Vm outputted from the last-stage inverter 20n represents the duration from the first-stage inverter 201 receiving the gate signal Vg to the last-stage inverter 20n outputting the monitor signal Vm. Then, the processing unit 103 converts the analog time delay signal into a corresponding digital information value. In addition, it is to be noted that a close-loop circuit is formed by coupling the inverters 201~20n in series, thereby forming a delay unit.

Once the first-stage inverter 201 receives the control signal Vb and the gate signal Vg, it is required a specific delay time to transmit the monitor signal Vm generated by the first-stage inverter 201 to the last-stage inverter 20n; wherein the delay time is proportional to the amount or number of the serially-coupled inverters 201-20n. In other words, the duration from the first-stage inverter 201 receiving the gate signal Vg to the last-stage inverter 20n outputting the monitor signal Vm increases with the amount or number of the serially-coupled inverters 201-20n. Once receiving the monitor signal Vm outputted from the last-stage inverter 20n, the processing unit 103 converts the analog time delay signal (that is, the duration from the first-stage inverter 201 receiving the gate signal Vg to the last-stage inverter 20n outputting the monitor signal Vm) contained in the received monitor signal Vm into a digital information value and determines whether the information value (delay time or duration) is located in a proper range or not through comparing the information value with a preset time in the stored lookup table. When the delay time is greater than the preset time, it is determined that the threshold voltages of the first transistors 21 and the second transistors 22 are relatively large so that the first transistors 21 and the second transistors 22 require more time to be turned on. Thus, the processing unit 103 correspondingly generates the digital signal Vd according to this delay time and outputs the digital signal Vd to the signal generating unit 101, thereby dynamically adjusting the control signal Vb generated by the signal generating unit 101 to reduce the threshold voltages of the first transistors 21, the second transistors 22 and the circuit elements in the circuit block 104 until the current delay time is modulated to the preset time recorded in the lookup table. In the present embodiment, because the signal monitoring unit 200 is implemented with N-type transistors, the control signal Vb is modulated to increase when the processing unit 103 detects that the information value of the time delay signal contained in the received monitor signal Vm is higher than the preset range, thereby decreasing the threshold voltages of the circuit elements controlled by the integrated circuit 100. In the present embodiment, the signal generating unit 101 is realized by a digital-to-analog signal converter (not shown); however, the present invention is not limited thereto.

Figure 3:
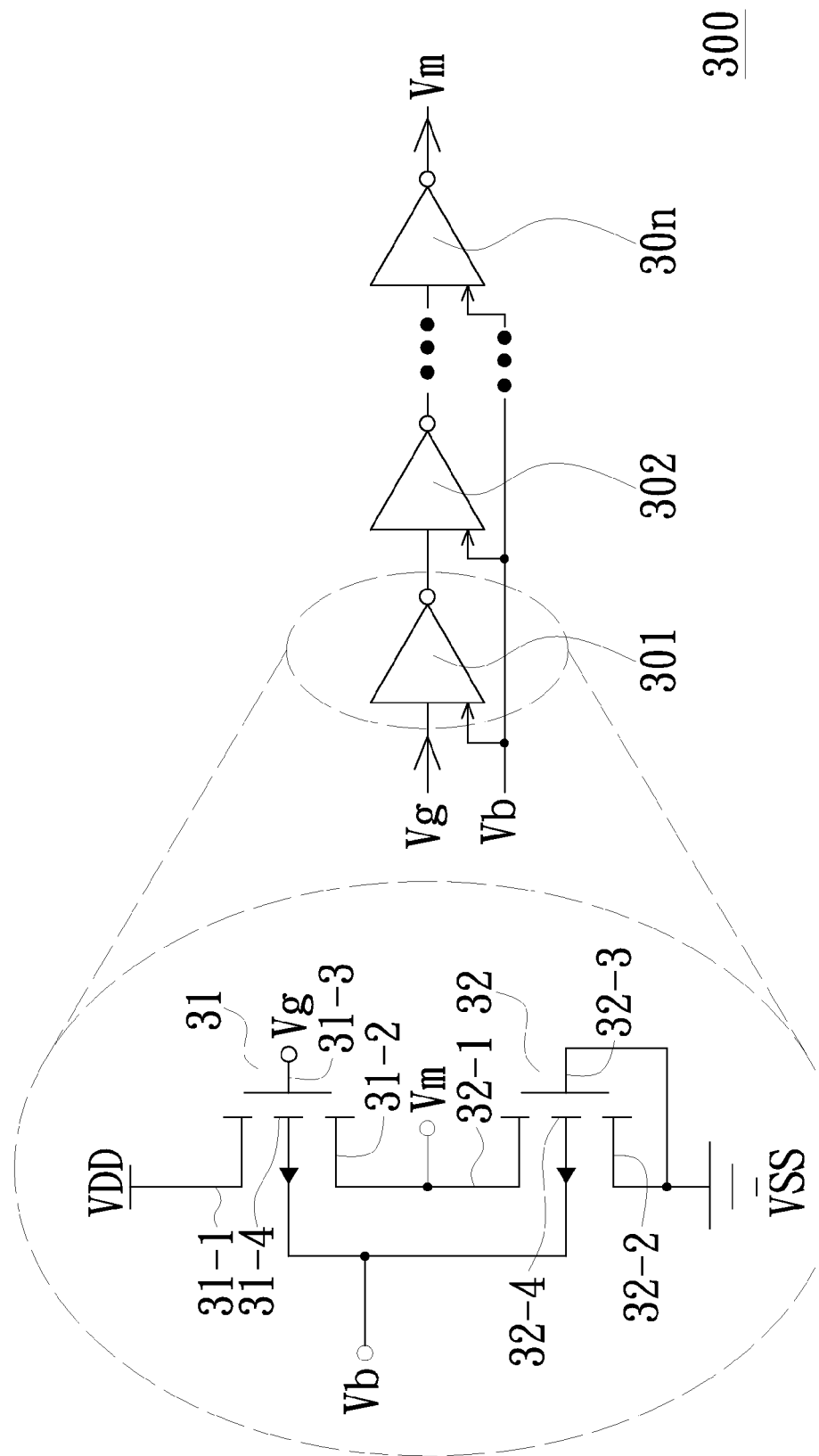
FIG. 3 is a schematic circuit diagram of a signal monitoring unit in accordance with another embodiment of the present invention.

FIG. 3 is a schematic circuit diagram of a signal monitoring unit in accordance with another embodiment of the present invention. As shown in FIG. 3, the signal monitoring unit 300 in the present embodiment is substantially implemented with a delay unit constituted by a plurality of stages of inverter coupled in series. Elements or signals in FIG. 3 that are identical to those shown in FIG. 2 are labeled with the same numberings for simplification. In addition, to facilitate a neat drawing, the labeling of source, drain, gate, base, first transistor and second transistor in FIG. 3 is omitted, please refer to FIG. 2 for the detail and no redundant detail is to be given herein. Specifically, the signal monitoring unit 300 includes a plurality of stages of inverters 301~30n coupled in series, wherein n is a positive integer. Each inverter includes a first transistor 31 and a second transistor 32, wherein the first transistor 31 and the second transistor 32 may be P-type transistors. The first transistor 31 has a first end 31-1, a second end 31-2, a gate end 31-3 and a base end 31-4. The first transistor 31 is configured to have its first end 31-1 for receiving the operating voltage VDD and its base end 31-4 for receiving the control signal Vb. The second transistor 32 has a first end 32-1, a second end 32-2, a gate end 32-3 and a base end 32-4. The second transistor 32 is configured to have its first end 32-1 electrically connected to the second end 31-2 of the first transistor 31, its second end 32-2 and the gate end 32-3 for receiving the reference voltage VSS, and its base end 32-4 electrically connected to the base end 31-4 of the first transistor 31. In the first-stage inverter 301, specifically, the first transistor 31 is further configured to have its gate end 31-3 for receiving the gate signal Vg and the second transistor 32 is configured to have its first end 32-1 electrically connected to the gate end 31-3 of the first transistor 31 in the second-stage inverter 302; wherein for brevity, the connection between the first-stage inverter 301 and the second-stage inverter 302 is not shown. In the last-stage inverter 30n, specifically, the second transistor 32 is further configured to have its first end 32-1 for outputting the monitor signal Vm. In addition, it is to be noted that the signal monitoring unit 300 in the present embodiment is configured to monitor the threshold voltages of the P-type transistors in the circuit block 104 in FIG. 1. In addition, it is to be noted that a close-loop circuit is formed by coupling the inverters 301~30n in series, thereby forming a delay unit.

The signal monitoring unit 300 of FIG. 3 and the signal monitoring unit 200 of FIG. 2 have the similar circuit structure. A difference lies in that the signal monitoring unit 200 of FIG. 2 adopts N-type transistors and the signal monitoring unit 300 of FIG. 3 adopts P-type transistors; thus, no nay redundant detail is to be given herein. In the present embodiment, because the signal monitoring unit 300 is implemented with P-type transistors, the control signal Vb is modulated to decrease when the processing unit 103 detects that the information value of the time delay signal (that is, the duration from the first-stage inverter 301 receiving the gate signal Vg to the last-stage inverter 30n outputting the monitor signal Vm) contained in the received monitor signal Vm is higher than the preset range, thereby decreasing the threshold voltages of the circuit elements in the integrated circuit 100 and the circuit block 104.

Figure 4:
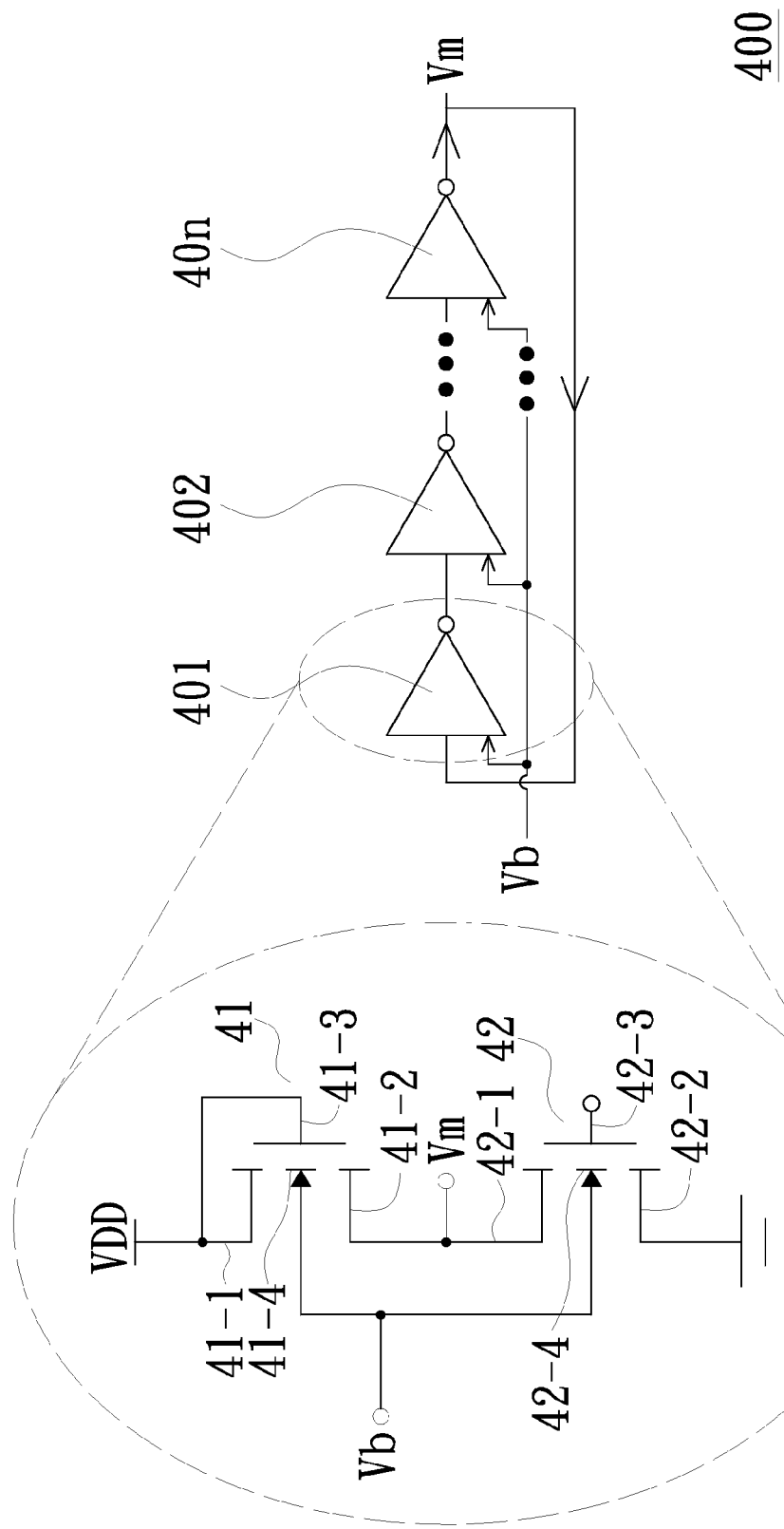
FIG. 4 is a schematic circuit diagram of a signal monitoring unit in accordance with still another embodiment of the present invention.

FIG. 4 is a schematic circuit diagram of a signal monitoring unit in accordance with still another embodiment of the present invention. To facilitate a neat drawing, the labeling of source, drain, gate, base, first transistor and second transistor in FIG. 4 is omitted, please refer to FIG. 2 for the detail and no redundant detail is to be given herein. As shown in FIG. 4, the signal monitoring unit 400 in the present embodiment is substantially implemented with an oscillator constituted by a plurality of stages of inverter coupled annularly and serially. Specifically, the signal monitoring unit 400 includes a plurality of stages of inverters 401~40n coupled annularly and serially, wherein n is a positive integer. Each inverter includes a first transistor 41 and a second transistor 42, wherein the first transistor 41 and the second transistor 42 may be N-type transistors. The first transistor 41 has a first end 41-1, a second end 41-2, a gate end 41-3 and a base end 41-4. The first transistor 41 is configured to have its gate end 41-3 and first end 41-1 for receiving the operating voltage VDD and its base end 41-4 for receiving the control signal Vb. The second transistor 42 has a first end 42-1, a second end 42-2, a gate end 42-3 and a base end 42-4. The second transistor 42 is configured to have its first end 42-1 electrically connected to the second end 41-2 of the first transistor 41, its second end 42-2 for receiving the reference voltage VSS, and its base end 42-4 electrically connected to the base end 41-4 of the first transistor 41. In the first-stage inverter 401, specifically, the second transistor 42 is further configured to have its first end 42-1 electrically connected to the gate end 42-3 of the second transistor 42 in the second-stage inverter 402; wherein for brevity, the connection between the first-stage inverter 401 and the second-stage inverter 402 is not shown. In the last-stage inverter 40n, specifically, the second transistor 42 is further configured to have its first end 42-1 for outputting the monitor signal Vm. Thus, in the first-stage inverter 401, the second transistor 42 is configured to have its gate end 42-3 for receiving the monitor signal Vm generated by the last-stage inverter 40n. In addition, it is to be noted that the signal monitoring unit 400 in the present embodiment is configured to monitor the threshold voltages of the N-type transistors in the circuit block 104 in FIG. 1.

In addition, it is to be noted that a close-loop circuit is formed by coupling the inverters 401~40n in series, thereby forming a delay unit.

The signal monitoring unit 400 of FIG. 4 and the signal monitoring unit 300 of FIG. 3 have the similar circuit structure. A difference lies in that the inverters 301~30n of the signal monitoring unit 300 of FIG. 3 are serially coupled to generate a time delay signal and the inverters 401~40n of the signal monitoring unit 400 of FIG. 4 are annularly and serially coupled to generate a frequency signal with specific oscillating frequency. Specifically, in the signal monitoring unit 400, the monitor signal Vm outputted from the last-stage inverter 40n is feedback to the first-stage inverter 401, thereby configuring the monitor signal Vm to have the oscillating frequency. Once receiving the monitor signal Vm outputted from the last-stage inverter 40n, the processing unit 103 determines whether the information value of the frequency signal contained in the received monitor signal Vm is located within a preset frequency range or not through comparing the information value with the preset frequency range in the stored lookup table. When it is determined that the information value of the frequency signal contained in the received monitor signal Vm is not located within the preset frequency range, the processing unit 103 correspondingly adjusts the control signal Vb generated by the signal generating unit 101 to modulate the threshold voltages of the first transistors 41 and the second transistors 42 until the oscillating frequency of the frequency signal is modulated within the preset frequency range. In the present embodiment, because the signal monitoring unit 400 is implemented with N-type transistors, the control signal Vb is modulated to increase when the processing unit 103 detects that the information value of the frequency signal contained in the received monitor signal Vm is lower than the preset range, thereby decreasing the threshold voltages of the circuit elements in the integrated circuit 100 and the circuit block 104.

Figure 5:
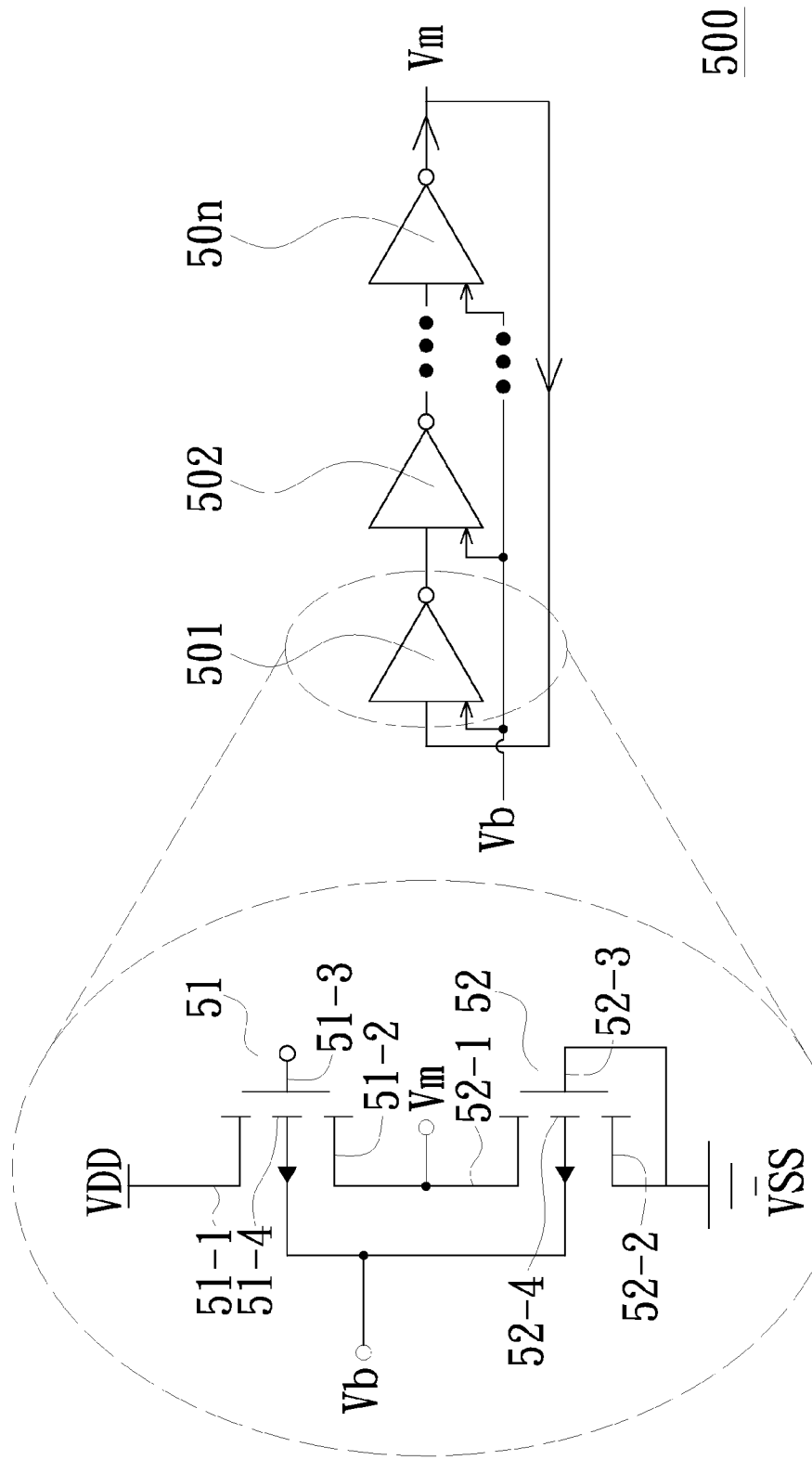
FIG. 5 is a schematic circuit diagram of a signal monitoring unit in accordance with yet another embodiment of the present invention.

FIG. 5 is a schematic circuit diagram of a signal monitoring unit in accordance with yet another embodiment of the present invention. To facilitate a neat drawing, the labeling of source, drain, gate, base, first transistor and second transistor in FIG. 5 is omitted, please refer to FIG. 2 for the detail and no redundant detail is to be given herein. As shown in FIG. 5, the signal monitoring unit 500 in the present embodiment is substantially implemented with an oscillator constituted by a plurality of stages of inverter coupled annularly and serially. Specifically, the signal monitoring unit 500 includes a plurality of stages of inverters 501~50n coupled annularly and serially, wherein n is a positive integer. Each inverter includes a first transistor 51 and a second transistor 52, wherein the first transistor 51 and the second transistor 52 may be P-type transistors. The first transistor 51 has a first end 51-1, a second end 51-2, a gate end 51-3 and a base end 51-4. The first transistor 51 is configured to have its first end 51-1 for receiving the operating voltage VDD and its base end 51-4 for receiving the control signal Vb. The second transistor 52 has a first end 52-1, a second end 52-2, a gate end 52-3 and a base end 52-4. The second transistor 52 is configured to have its first end 52-1 electrically connected to the second end 51-2 of the first transistor 51, its second end 52-2 and gate end 52-3 for receiving the reference voltage VSS, and its base end 52-4 electrically connected to the base end 51-4 of the first transistor 51. In the first-stage inverter 501, specifically, the second transistor 52 is further configured to have its first end 52-1 electrically connected to the gate end 51-3 of the first transistor 51 in the second-stage inverter 502; wherein for brevity, the connection between the first-stage inverter 501 and the second-stage inverter 502 is not shown. In the last-stage inverter 50n, specifically, the second transistor 52 is further configured to have its first end 52-1 electrically connected to the gate end 51-3 of the first transistor 51 in the first-stage inverter 501 and the second transistor 52 is configured to have its first end 52-1 for outputting the monitor signal Vm. Thus, in the first-stage inverter 501, the first transistor 51 is configured to have its gate end 51-3 for receiving the monitor signal Vm generated by the last-stage inverter 50n. In addition, it is to be noted that the signal monitoring unit 500 in the present embodiment is configured to monitor the threshold voltages of the P-type transistors in the circuit block 104 in FIG. 1. In addition, it is to be noted that a close-loop circuit is formed by coupling the inverters 501~50n in series, thereby forming a delay unit.

The signal monitoring unit 500 of FIG. 5 and the signal monitoring unit 400 of FIG. 4 have the similar circuit structure. A difference lies in that the signal monitoring unit 400 of FIG. 4 adopts N-type transistors and the signal monitoring unit 500 of FIG. 5 adopts P-type transistors; thus, no nay redundant detail is to be given herein. It is to be noted that the signal monitoring units 400 and 500 each is substantially implemented with an annular oscillator constituted by a plurality of stages of inverter coupled in series. Thus, besides generating the frequency signal with specific oscillating frequency, the oscillator can also generate a phase delay signal with specific phase corresponding to the oscillating frequency. Accordingly, once receiving the monitor signal Vm, the processing unit 103 determines whether the information value of the phase delay signal contained in the received monitor signal Vm is located within a preset phase range or not through comparing the information value with the preset phase range in the stored lookup table. When it is determined that the information value of the phase delay signal contained in the received monitor signal Vm is not located within the preset phase range, the processing unit 103 correspondingly adjusts the control signal Vb generated by the signal generating unit 101 until the information value of the phase delay signal is modulated within the preset phase range. In the present embodiment, because the signal monitoring unit 500 is implemented with P-type transistors, the control signal Vb is modulated to decrease when the processing unit 103 detects that the information value of the phase delay information contained in the received monitor signal Vm is higher than the preset phase range, thereby decreasing the threshold voltages of the circuit elements in the integrated circuit 100 and the circuit block 104.

Figure 6:
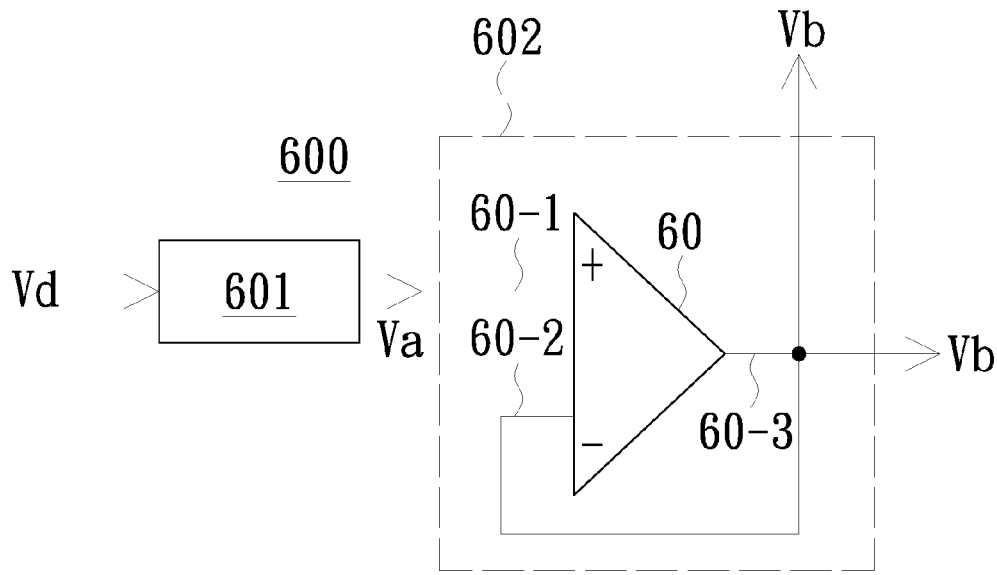
FIG. 6 is a schematic circuit diagram of a signal generating unit in accordance with an embodiment of the present invention.

In one embodiment, the signal generating unit in FIG. 1 may be implemented with a digital-analog converter (DAC) and a unity gain buffer. FIG. 6 is a schematic circuit diagram of a signal generating unit in accordance with an embodiment of the present invention. As shown in FIG. 6, the signal generating unit 600 in the present embodiment includes a digital-analog converter 601 and a unity gain buffer 602. The digital-analog converter 601 is configured to receive the digital signal Vd, convert the received digital signal Vd into an analog signal Va and output the analog signal Va. The unity gain buffer 602 includes an amplifying unit 60. The amplifying unit 60 has a first input end 60-1, a second input end 60-2 and an output end 60-3. Specifically, the first input end 60-1 is configured for receiving the analog signal Va (e.g., a voltage signal) from the digital-analog converter 601 and the second input end 60-2 is electrically connected to the output end 60-3. Thus, the amplifying unit 60 is formed with a negative feedback circuit structure; wherein the gain of the negative feedback circuit structure is 1 and the output impedance is 0, substantially. The unity gain buffer 602 is configured to process the received analog signal Va and accordingly outputs the adjusted control signal Vb to the base ends of all of the transistors in the inverters until the monitor signal Vm is located within the preset range. Accordingly, the control signal Vb outputted from the signal generating unit 600 can drive the signal monitoring unit 102 (FIG. 1) and the circuit elements in the circuit block 104 (FIG. 1) more effectively. The amplifying unit 60 is further configured to have its output end 60-3 electrically connected to the base ends of all of the transistors in any one of the aforementioned disclosed signal monitoring unit. Thus, the amplifying unit 60 can process the received analog signal Va and output the control signal Vb, which is used for driving, for example, the signal monitoring unit 102 and the circuit block 104. In the present embodiment, the amplifying unit 60 is realized by a rail-to-rail amplifier, which is configured to, for example, provide a sufficient driving capability to the base ends of the first and second transistors in the signal monitoring unit 102, but the present invention is not so limited. It is understood that the digital-analog converter 601 and the unity gain buffer 602 can be implemented with other elements or circuits with similar functions.

Figure 7:
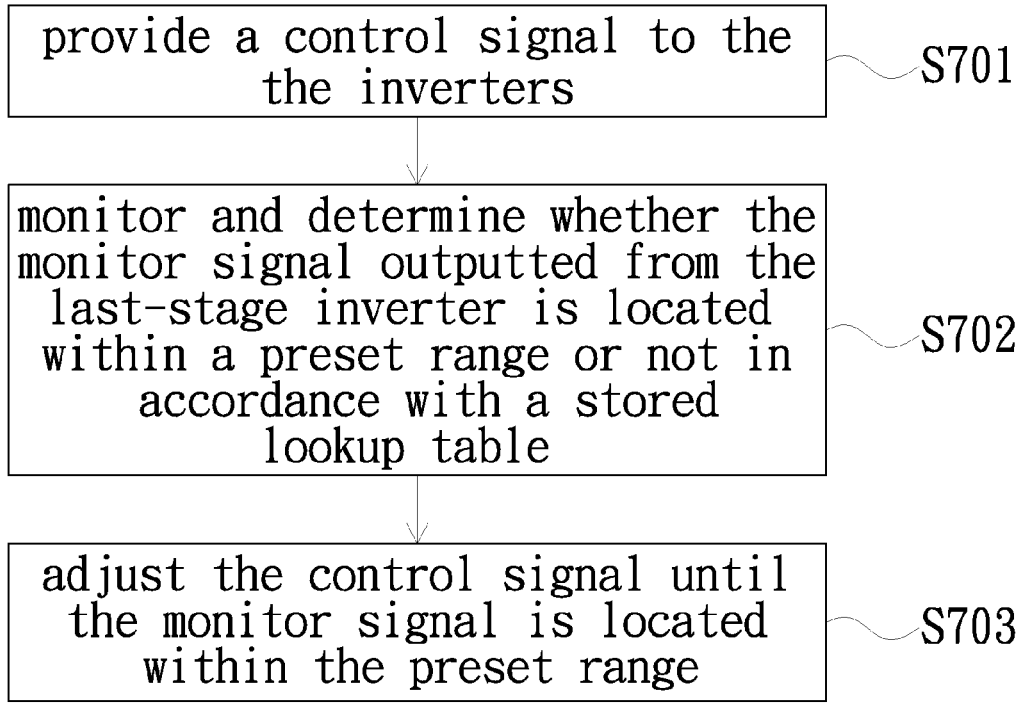
FIG. 7 is a flowchart of a signal monitoring method in accordance with an embodiment of the present invention.

The operations of the aforementioned integrated circuit 100 can be summarized as a signal monitoring method. FIG. 7 is a flowchart of a signal monitoring method in accordance with an embodiment of the present invention. As shown in FIG. 7, the signal monitoring method adapted to use with the integrated circuit 100 in the present embodiment includes the following steps: providing a control signal to the inverters (Step S701); monitoring and determining whether the monitor signal outputted from the last-stage inverter is located within the preset range or not in accordance with the stored lookup table (Step S702); and adjusting the control signal until the monitor signal is located within the preset range (Step S703). It is to be noted that in Step S701, besides being transmitted to the inverters, the control signal is also transmitted to the circuit block 104 controlled by the integrated circuit 100, thereby adjusting the threshold voltages of the circuit elements in the circuit blocks 104 to a proper value. In Step S702, the monitor signal is converted into a digital information value by the processing unit 103 in FIG. 1 and the processing unit 103 then determines whether the digital information value is located within the preset range or not in accordance with the stored lookup table. As described above, the integrated circuit 100 in one embodiment may not include the processing unit 103. Instead of the processing unit 103, an additional circuit may be arranged outside the integrated circuit 100 and configured to monitor and determine whether the monitor signal is located within the preset range or not and then correspondingly adjust the control signal. However, regardless of whether the integrated circuit 100 is equipped with the processing unit 103, the signal monitoring method including Steps S701-S703 is always suitable for the integrated circuit 100.

In summary, the integrated circuit of the present invention employs the aforementioned circuit structure to monitor and adjust the aforementioned monitor signal, outputs the adjusted control signal to the circuit block which is controlled by the integrated circuit, and determines whether the monitor signal outputted from of the signal monitoring unit is within a preset range based on the lookup table stored in the processing unit. Specifically, when it is determined that the monitor signal is not within the preset range, the control signal generated by the signal generating unit is adjusted until the motor signal is within the preset range recorded in the lookup table. In addition, through the signal monitoring unit, the integrated circuit of the present invention generates the time delay signal, frequency signal or phase delay signal which are corresponding to the threshold voltage. These analog signals corresponding to the threshold voltage are converted into digital information by the processing unit and the digital information is used to determine whether the control signal is needed to adjust based on a comparison between the threshold voltage restored in the lookup table and a preset value of the digital information. Then, the threshold voltage of each element in the circuit block controlled by the integrated circuit of the present invention can be adjusted through adjusting the control signal. As a result, the threshold voltage of each element in the circuit block controlled by the integrated circuit of the present invention can be effectively adjusted to locate within the preset range and consequentially the entire circuit can be operated more quickly and stably.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit, comprising:
a signal generating unit, configured to generate a control signal;
a signal monitoring unit, configured to receive the control signal and accordingly output a monitor signal; and
a processing unit, configured to receive the monitor signal and output a digital trimming code to the signal generating unit when the monitor signal is not located within a preset range;
wherein the control signal is adjusted until the monitor signal is located within the preset range.

2. The integrated circuit according to claim 1, wherein the signal monitoring unit is a signal carrier configured to receive the control signal and generate a corresponding time delay signal as the monitor signal.

3. The integrated circuit according to claim 2, wherein the signal monitoring unit comprises a delay unit, the delay unit comprises at least one inverter, the at least one inverter comprising a plurality of transistors, and the transistors of the inverters are configured to have their base ends electrically connected together for receiving the control signal.

4. The integrated circuit according to claim 3, wherein the monitor signal has a delay time to the control signal, and the processing unit determines the control signal through comparing the delay time.

5. The integrated circuit according to claim 4, wherein each inverter of the delay unit comprises:
a first transistor, having a source end, a drain end, a gate end and a base end, the first transistor being configured to have its gate end and source end for receiving an operating voltage and its base end for receiving the control signal; and
a second transistor, having a source end, a drain end, a gate end and a base end, the second transistor being configured to have its drain end electrically connected to the drain end of the first transistor as the inverter output, its source end for receiving a reference voltage, its base end electrically connected to the base end of the first transistor, and its gate end as the inverter input, wherein the delay unit is formed by coupling the inverters in series.

6. The integrated circuit according to claims 5, wherein the signal generating unit further comprises a digital-analog converter and a unity gain buffer, the digital-analog converter converts the received digital trimming code into an analog signal and outputs the analog signal to the unity gain buffer, the unity gain buffer is configured to process the received analog signal and accordingly outputs the adjusted control signal to the base ends of all of the transistors in the inverters until the monitor signal is located within the preset range.

7. The integrated circuit according to claim 4, wherein each inverter of the delay unit comprises:
   a first transistor, having a source end, a drain end, a gate end and a base end, the first transistor being configured to have its source end for receiving an operating voltage and its base end for receiving the control signal, its gate end as the inverter input; and
   a second transistor, having a source end, a drain end, a gate end and a base end, the second transistor being configured to have its drain end electrically connected to the drain end of the first transistor as the inverter output, its source end and gate end for receiving a reference voltage, and its base end electrically connected to the base end of the first transistor,
   wherein the delay unit is formed by coupling the inverters in series.

8. The integrated circuit according to claims 7, wherein the signal generating unit further comprises a digital-analog converter and a unity gain buffer, the digital-analog converter converts the received digital trimming code into an analog signal and outputs the analog signal to the unity gain buffer, the unity gain buffer is configured to process the received analog signal and accordingly outputs the adjusted control signal to the base ends of all of the transistors in the inverters until the monitor signal is located within the preset range.

9. The integrated circuit according to claim 1, wherein the signal monitoring unit is a signal carrier configured to receive the control signal and generate a corresponding frequency phase delay signal as the monitor signal.

10. The integrated circuit according to claim 9, wherein the signal monitoring unit comprises an oscillator, the oscillator comprises at least one inverter, and the transistors of the inverters are configured to have their base ends electrically connected together for receiving the control signal.

11. The integrated circuit according to claim 10, wherein the monitor signal has a frequency phase delay to the control signal, and the processing unit determines the control signal through comparing the frequency phase delay.

12. The integrated circuit according to claim 11, wherein each inverter of the oscillator comprises:
   a first transistor, having a source end, a drain end, a gate end and a base end, the first transistor being configured to have its gate end and source end for receiving an operating voltage and its base end for receiving the control signal; and
   a second transistor, having a source end, a drain end, a gate end and a base end, the second transistor being configured to have its drain end electrically connected to the drain end of the first transistor as inverter output, its source end for receiving a reference voltage, its base end electrically connected to the base end of the first transistor, and its gate end as the inverter input;
   wherein a close-loop circuit is formed by coupling the inverters in series, thereby forming the oscillator.

13. The integrated circuit according to claims 12, wherein the signal generating unit further comprises a digital-analog converter and a unity gain buffer, the digital-analog converter converts the received digital trimming code into an analog signal and outputs the analog signal to the unity gain buffer, the unity gain buffer is configured to process the received analog signal and accordingly outputs the adjusted control signal to the base ends of all of the transistors in the inverters until the monitor signal is located within the preset range.

14. The integrated circuit according to claim 11, wherein each inverter of the oscillator comprises:
   a first transistor, having a source end, a drain end, a gate end and a base end, the first transistor being configured to have its source end for receiving an operating voltage and its base end for receiving the control signal, its gate end as the inverter input; and
   a second transistor, having a source end, a drain end, a gate end and a base end, the second transistor being configured to have its drain end electrically connected to the drain end of the first transistor as the inverter output, its source end and gate end for receiving a reference voltage, and its base end electrically connected to the base end of the first transistor,
   wherein a close-loop circuit is formed by coupling the inverters in series, thereby forming the oscillator.

15. The integrated circuit according to claims 14, wherein the signal generating unit further comprises a digital-analog converter and a unity gain buffer, the digital-analog converter converts the received digital trimming code into an analog signal and outputs the analog signal to the unity gain buffer, the unity gain buffer is configured to process the received analog signal and accordingly outputs the adjusted control signal to the base ends of all of the transistors in the inverters until the monitor signal is located within the preset range.

16. A signal monitoring method used with an integrated circuit, the integrated circuit comprising a signal generating unit, a signal monitoring unit and a processing unit, the signal monitoring method comprising:
   configuring the signal generating unit to provide a control signal to the substrates of all transistors in the signal monitoring unit;
   configuring the signal monitoring unit to output a monitor signal according to the received control signal, converting the monitor signal into meaningful monitoring information and determining whether the monitoring information is located within a preset range recorded in a lookup table; and
   adjusting the control signal until the monitoring information is located within the preset range.

17. A signal monitoring method used with a plurality of transistors, the signal monitoring method comprising:
   providing a control signal to the substrates of the transistors;
   converting a monitor signal, which is outputted from the transistors based on the received control signal, into meaningful monitoring information and determining whether the monitoring information is located within a preset range recorded in a lookup table; and
   adjusting the control signal until the monitoring information is located within the preset range.

* * * * *